United States Patent
Sarhad et al.

(10) Patent No.: US 9,863,976 B2
(45) Date of Patent: Jan. 9, 2018

(54) MODULE TEST SOCKET FOR OVER THE AIR TESTING OF RADIO FREQUENCY INTEGRATED CIRCUITS

(71) Applicant: Keyssa Systems, Inc., Campbell, CA (US)

(72) Inventors: Bhupendra Sakerlal Sarhad, Pleasanton, CA (US); Christopher Scott Sansom, Santa Clara, CA (US)

(73) Assignee: Keyssa Systems, Inc., Campbell, CA (US)

( * ) Notice: Subject to any disclaimer, the term of this patent is extended or adjusted under 35 U.S.C. 154(b) by 118 days.

(21) Appl. No.: 14/880,174

(22) Filed: Oct. 9, 2015

(65) Prior Publication Data
US 2017/0102409 A1  Apr. 13, 2017

(51) Int. Cl.
*G01R 1/04* (2006.01)
*G01R 31/28* (2006.01)
(Continued)

(52) U.S. Cl.
CPC ............ *G01R 1/045* (2013.01); *G01R 31/045* (2013.01); *G01R 31/2822* (2013.01); *G01R 31/303* (2013.01); *G01R 31/31905* (2013.01)

(58) Field of Classification Search
USPC ......... 324/756.02, 756.01, 537, 500, 750.27, 324/750.01, 750.02, 750.16, 750.26, 324/762.02, 601, 638, 750.3, 754.03, 324/762.01, 512, 637, 702, 750.19, 324/754.01, 754.31, 756.07; 333/239; 374/2; 455/67.14; 606/33
See application file for complete search history.

(56) References Cited

U.S. PATENT DOCUMENTS 5,262,355 A * 11/1993 Nishiguchi ....... H01L 21/67144
29/833
6,201,403 B1  3/2001 Rollin et al.
(Continued)

FOREIGN PATENT DOCUMENTS

KR  10-2010-0111278 A  10/2000
WO  WO 2013/130486 A1  9/2013

OTHER PUBLICATIONS

PCT International Search Report and Written Opinion, PCT Application No. PCT/US2016/054966, dated Jan. 13, 2017, 10 pages.
(Continued)

*Primary Examiner* — Melissa Koval
*Assistant Examiner* — Nasima Monsur
(74) *Attorney, Agent, or Firm* — Fenwick & West LLP

(57) ABSTRACT

A test system includes a test socket assembly for capturing low energy electromagnetic emissions from radio frequency (RF) integrated circuits (ICs). The test socket assembly is structured to direct electromagnetic radiation from the device under test (DUT) to a socket port coupled to one end of a waveguide for transmission to a tester. The combination of the materials comprising the socket assembly is selected to more efficiently couple electromagnetic emissions from the DUT into the waveguide. For example, a reflective plane with an adjustable position may be located below the DUT in order to increase coupling of electromagnetic radiation from the DUT into the waveguide.

32 Claims, 7 Drawing Sheets

(51) Int. Cl.
*G01R 31/319* (2006.01)
*G01R 31/04* (2006.01)
*G01R 31/303* (2006.01)

(56) References Cited

U.S. PATENT DOCUMENTS

| | | | |
|---|---|---|---|
| 8,436,777 B2 * | 5/2013 | Ito | G01R 29/10 343/703 |
| 9,588,173 B2 | 3/2017 | Isaac et al. | |
| 2007/0063914 A1 | 3/2007 | Becker | |
| 2009/0051366 A1 | 2/2009 | Miyauchi et al. | |
| 2009/0115440 A1 | 5/2009 | Bergmann | |
| 2009/0153158 A1 * | 6/2009 | Dunn | G01R 31/2822 324/762.01 |
| 2009/0189623 A1 * | 7/2009 | Campbell | G01R 1/06772 324/756.03 |
| 2010/0171669 A1 | 7/2010 | Ito et al. | |
| 2010/0207638 A1 | 8/2010 | Nien et al. | |
| 2011/0080187 A1 * | 4/2011 | Hotz | G01R 31/2889 324/756.02 |
| 2011/0169117 A1 * | 7/2011 | McIntosh | H01L 27/1446 257/432 |
| 2012/0176150 A1 | 7/2012 | Hsu et al. | |
| 2012/0268153 A1 | 10/2012 | Nickel et al. | |
| 2012/0293379 A1 | 11/2012 | Nickel et al. | |
| 2013/0093447 A1 | 4/2013 | Nickel et al. | |
| 2013/0293249 A1 | 11/2013 | Han et al. | |
| 2015/0168486 A1 * | 6/2015 | Isaac | G01R 31/2889 324/756.02 |

OTHER PUBLICATIONS

European Extended Search Report, European Application No. 13899714.3, dated Jul. 31, 2017, 8 pages.

* cited by examiner

MODULE TEST SOCKET FOR OVER THE AIR TESTING OF RADIO FREQUENCY INTEGRATED CIRCUITS

BACKGROUND

1. Technical Field

This disclosure relates to a system for testing extremely high frequency (EHF) integrated circuits, and in particular for over-the-air testing of EHF integrated circuits in an automated test environment.

2. Description of the Related Arts

The adoption of wireless communication technologies continues to increase. Many of these devices employ radio frequency (RF) integrated circuits (ICs) that operate as transmitters, receivers, or transceivers that enable wireless intra and inter device communication. As demand for wireless communication enabled devices increases and a faster time to market becomes more important, the process of evaluating RF ICs becomes even more important.

Systems for evaluating RF ICs include automated test equipment equipped to perform over-the-air testing of RF ICs. Examples of automated test systems used to evaluate RF ICs include wafer probe testing, automated test equipment (ATE), test fixtures using horn antennas, and module testing using a reference device or known good device (KGD testing). Using dedicated ports, however, increases design complexity and consumes valuable chip area that could be used for additional functionality. Known-good device testing provides the ability to test multiple devices under test (DUT)s simultaneously, without the drawbacks of using dedicated RF test ports. However, the test coverage of KGD testing is limited to pass/fail testing. The lack of parametric testing limits both developmental stage testing and product testing.

Horn antenna based test fixtures suffer from drawbacks related to their large size relative to the typical size of an RF IC DUT. Horn antennas create physical limitations on how closely horn antennas may be placed relative to the DUTs and the minimum distance required between adjacent DUTs. Horn antennas are large and use of them physically limits the distance between the antenna and DUT. This necessarily results in bulky test fixtures. Additionally, the distance between horn antennas and DUTs may inhibit the horn antennas' ability to capture electromagnetic signals transmitted by low energy DUTs. For example, the center of horn antennas that are 20 mm×20 mm should be at least 20 mm apart so corresponding DUTs should also be at least 20 mm apart. DUTs, however, should be placed even further from each other than 20 mm in order to decrease interference.

Moreover, when using horn antennas to capture electromagnetic signals transmitted from DUTs, radiation chambers are used to optimize the amount of electromagnetic radiation captured from the DUT. This is undesirable because radiation chambers further contribute to the bulk of test fixtures. Horn antennas may also capture and amplify cross talk. As a result, DUTs must be widely separated from each other to decrease cross talk, further contributing to the bulk of multi-site test fixtures. Horn antennas have inherent gain, and as a result amplify and transmit to the tester all interference received by the horn antennas. This results in less accurate testing and limits the ability to simultaneously test a plurality of DUTs due to both spatial and interference limitations. Additionally, horn antennas are inefficient transmitters and thus undesirable for testing receiver DUTs. As a result, DUTs must be placed far from each other to decrease cross talk, further contributing to the bulk of multi-site test fixtures.

SUMMARY

A disclosed test system includes a test socket assembly for capturing low energy electromagnetic emissions from extremely high frequency integrated circuits. The test socket assembly is structured to couple electromagnetic radiation from the DUT into a waveguide. The waveguide preferably is integrated into the test socket. That is, one end of the waveguide is positioned within the test socket assembly through an aperture. In one embodiment, the test socket includes a socket base and a socket lid. The DUT is supported by the socket base during testing. The socket lid houses a plunger that is displaced to push the DUT towards the socket base to ensure electrical connection between contact pads on the DUT and test probes. The materials on the surfaces of the socket, including the surfaces of the socket lid and plunger preferably are selected to increase coupling of EHF radiation from the DUT into the waveguide. For example, reflective sheets may be incorporated into the plunger or into the socket lid. More reflective socket wall materials may be chosen to increase the reflection of DUT signals into the waveguide. More absorptive socket wall materials may be chosen to reduce unwanted scattered signals. In one embodiment, a reflective plane is located in the socket base below the DUT in order to increase the coupling of the electromagnetic radiation emitted from the DUT into the waveguide. The position of the reflective plane may be adjusted by a position adjustment mechanism to further increase coupling.

In another embodiment, the socket assembly may include multiple waveguides for testing modules with multiple DUTs. In one implementation, each DUT may be paired with a waveguide port, where adjacent waveguide ports may be positioned relatively close to each other, for example too close to allow testing by horn antennas. Employing multiple waveguides allows multiple DUTs to be tested at the same time or in parallel. In another implementation, multiple DUTs may be paired with a single waveguide. In such an implementation, each DUT of the pair is tested at a different time.

Other aspects include components, devices, systems, improvements, methods, processes, applications, and other technologies related to any of the above.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

The Figures (FIG.) and the following description relate to preferred embodiments of the present disclosure by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the embodiments described herein.

Close proximity testing involves detecting and measuring low power electromagnetic radiation generated by RF circuitry on integrated circuits where the detector is placed in close proximity (typically 0.1 mm to 20 mm) to the emitting DUT. During testing, the detectable range of power depends on the detector included in the test system 100. In one implementation, the detectable range of power includes a range from −5 dBm to 5 dBm. In other implementations, the detectable range of power may be configured based on the parameters of the DUT, such as the DUT transmitter power. In close-proximity communication, receiving and transmitting radiative elements are placed in the near field, typically between 0.1 mm and 20 mm from each other, when transmitting through air. This distance range of 0.1 mm to 20 mm may be modified with additional components, such as electromagnetic lens plastics, dissipative materials, and reflective materials.

For close proximity contactless transmission of video and other data that require high data rates, some contactless interconnect systems employ Extremely High-Frequency (EHF) electromagnetic radiation, with a frequency in the range of 30 GHz to 300 GHz. This frequency allows for data rates as much as 1,000 times faster than with RF transmissions in the MHz range. However, the wavelength of radiation is also much shorter. Accordingly, test systems for evaluating the performance of EHF integrated circuit devices pose even stricter constraints on proximity of signal detectors to accurately detect a threshold level of electromagnetic radiation in the EHF spectrum of electromagnetic radiation and propagate the detected energy to the tester for analysis.

Figure 1:
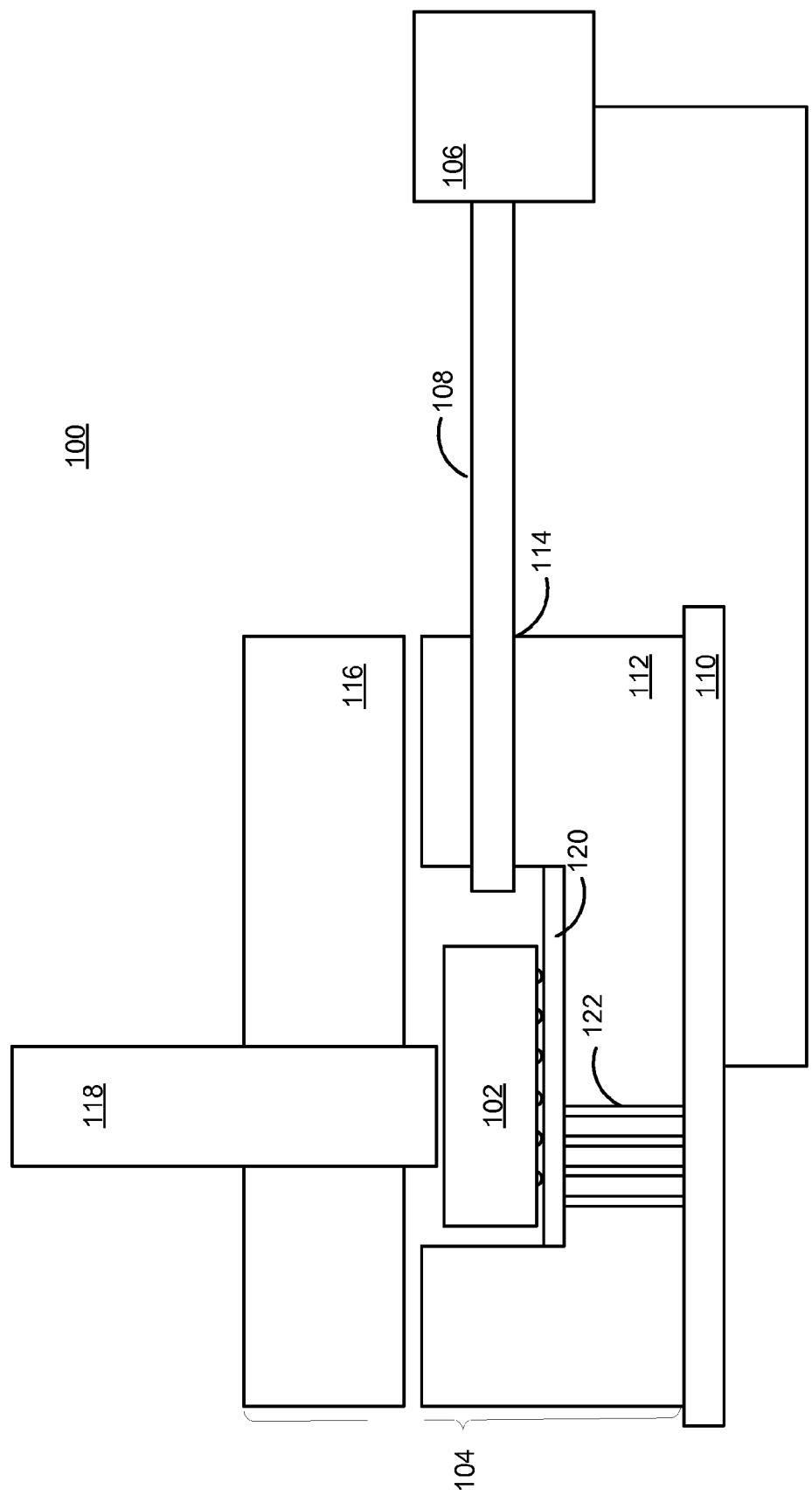
FIG. 1 illustrates an example of a test system including a test socket coupled to an integrated waveguide for close proximity testing of extremely high frequency integrated circuits, in accordance with an embodiment.

FIG. 1 shows a test system 100 for testing an integrated circuit device 102, which is referred to as the device-under-test (DUT) 102. The test system 100 includes a test socket 104 that holds the DUT 102 during testing, and an interface board 110 electrically connected between tester instrumentation 106 and electrical contacts of the DUT 102 during testing. The tester instrumentation 106 may include a tester or controller configured to send test signals to the test socket 104 via the interface board 110 and receive information from the DUT 102 responsive to the test signals. In some embodiments, the tester instrumentation includes a golden or master receiver or transmitter, and/or other instrumentation used for testing a DUT 102. The DUT 102 includes a radiative element that emits close-proximity electromagnetic radiation. In one embodiment, the electromagnetic radiation emitted from the DUT 102 is EHF radiation having a frequency between 30 GHz and 300 GHz. The direction in which the radiation emits electromagnetic radiation from the radiative element within the DUT (e.g., side surface) of an RF IC under test. In another embodiment, the radiative element emits a maximum amount of electromagnetic radiation in a direction that is primarily orthogonal to major surface (e.g., top surface) of the RF IC under test. In one embodiment, the directionality the electromagnetic radiation emitted from the radiative element may be determined based on the configuration of a ground plane included in the RF IC relative to the radiative element as further described in U.S. patent application Ser. No. 13/541,543, which is incorporated by reference herein in its entirety.

The test system 100 includes a waveguide 108 having a first end positioned to receive electromagnetic radiation emitted by the DUT 102 during testing. The waveguide 108 captures electromagnetic radiation, such as EHF radiation, from within a near field envelope generated by the DUT 102 and transports that radiation to a detector or receiver through a second end coupled to the tester instrumentation 106. The waveguide 108 may be a dielectric waveguide, such as a plastic waveguide. Plastic material with a high relative permittivity (dielectric constant of 2.0 or greater) and low loss characteristics in the EHF band may be selected so that the waves are carried for a longer distance than through air. Plastic materials such as Low-Density Polyethylene (LDPE) have such characteristics. The walls of the plastic waveguide may be coated with aluminum or other metal, such as by deposition, to reflect the EHF waves back into the plastic material. The plastic may also be surrounded with lower dielectric constant material, such as foam. The plastic material of the waveguide 108 may be flexible, allowing it to act as a cable carrying EHF radiation. In some embodiments, the waveguide 108 may be a hollow structure.

In one embodiment, during testing, the first end of the waveguide 108 is integrated into the test socket 104 and extends through an aperture 114 in a side wall of the test socket 104 into a socket cavity formed by the socket walls of the socket base 112. One end of the waveguide 108 is substantially aligned with electromagnetic radiation produced by or sent to the DUT 102, as later discussed with reference to FIG. 3. When testing a DUT 102 as a transmitter under this embodiment, the DUT 102 transmits electromagnetic signals, which are coupled through the first end into the waveguide 108. The electromagnetic signals propagate through the waveguide 108 and are received by the tester instrumentation 106. In testing a DUT 102 as a receiver, the tester instrumentation 106 transmits signals, which are coupled through the opposite end into the waveguide 108 and propagate through the waveguide 108 to the DUT 102. Both transmitter and receiver DUTs 102 (including transceiver DUTs) may be tested in this and the following embodiments.

An alternative embodiment involves a non-integrated waveguide whereby the first end of the waveguide 108 is not inserted into the socket cavity of the test fixture 104. Rather, the first end of the waveguide 108 is outside of the test socket 104 and substantially aligned with the test socket 104. The following embodiments may utilize integrated waveguides, non-integrated waveguides or a combination of both.

Non-integrated waveguides may be used in place of or in combination with the above embodiments. This embodiment may be desirable when there are test socket 104 limitations and/or in situations where the DUT 102 radiates a signal having a strength of at least 0 dBm. Similarly, this embodiment may be desirable in situations where the tester instrumentation 106 transmits a strong signal through the waveguide 108 that is received by the DUT 102.

In some embodiments, to increase the amount of electromagnetic radiation coupled from the DUT 102 into the waveguide 108, one or more elements may be positioned between the DUT 102 and the waveguide 108 or between the DUT 102 and the test socket 104. Example elements include amplifying elements such as a radiative element, or passive circuit elements such as capacitors, resistors, or inductors.

The test socket 104 includes a socket base 112 and socket lid 116. One surface of the socket base 112 includes a socket body guide 120 (typically, an interconnect board), which has test probes (e.g., pogo pins) 122 connected to it. The socket lid 116 houses a plunger 118 that may be displaced to push the DUT 102 towards the socket body guide 120 to ensure electrical connection between contact pads on the DUT and the test probes 122. Socket materials may be selected to increase coupling of the emitted electromagnetic radiation into the waveguide 108, depending on the characteristics of different radiative elements included in different DUTs 102 as further described in FIG. 3.

In automatic operation, the tester instrumentation 106 controls the plunger 118 to automatically and sequentially obtain and then press DUTs 102 into the socket cavity for testing. When the DUT 102 is positioned in the socket cavity, the tester instrumentation 106 activates DUT 102 by sending test signals to the test interface board 110, which in turn are propagated the DUT 102 through the test probes 122. Test signals generated by the tester instrumentation 106 may be used to perform parametric testing of the DUT 102. Example parametric tests include radiated power, receiver sensitivity, and transmitter and receiver jitter for a communication device that transmits and/or receives electrical conditions over an electromagnetic interface. For example, to test a transmitter functionality of a DUT 102, the test signals may cause a radiative element within the DUT 102 to emit electromagnetic radiation in a particular pattern depending on the characteristics of the DUT's 102 radiative element.

Figure 2:
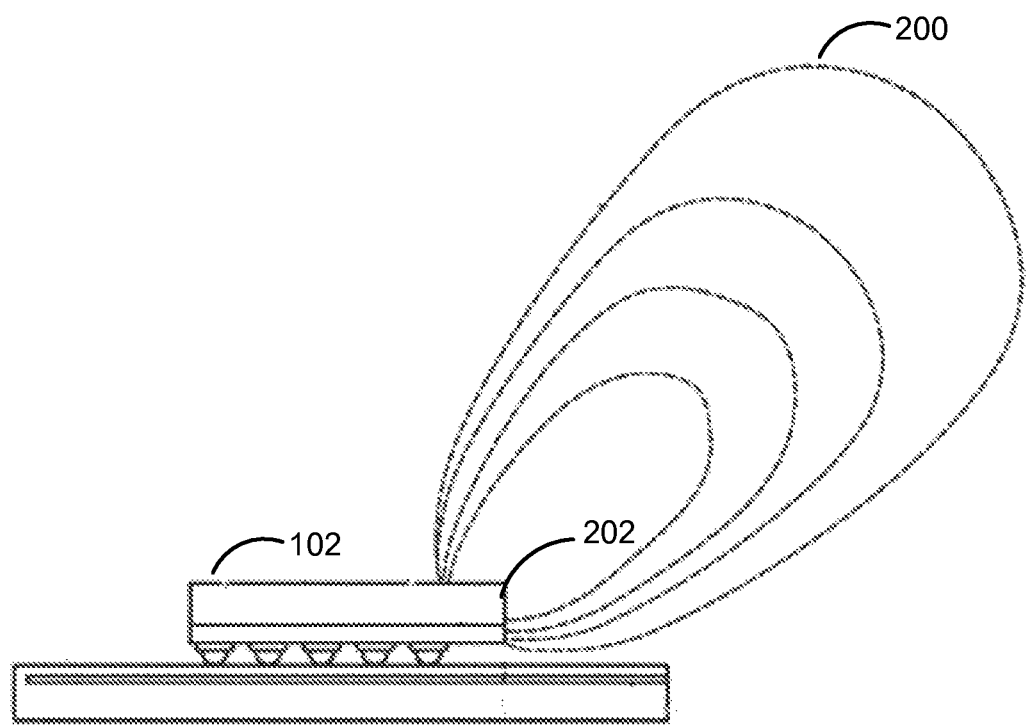
FIG. 2 illustrates an example radiation pattern emitted from an extremely high frequency integrated circuit, in accordance with an embodiment.

FIG. 2 shows an example radiation pattern emitted from a DUT 102. The radiative element located within the DUT 102 and proximate to a side face 202 of the package of the DUT 102 directs emissions generally to the side of DUT 102. A DUT 102 with a radiative element positioned in such a manner may be referred to as a side-emitting. The radiated signal intensity and the physical geometry of the radiative element within the DUT 102 causes electromagnetic radiation waves to have a pattern that may generally be described as having an envelope 200 where radiation intensities within envelope 200 are above a threshold amount, such as to be detectable by a receiver coupled to the tester instrumentation 106. Envelope 200 may be a free space envelope around DUT 102 or may be modified by structures, such as of metal, plastic, or dissipative materials placed near the DUT 102, such as the materials on the surface of the socket cavity of the test socket 104 and the plunger 118.

Returning to FIG. 1, in some implementations, during testing, the DUT 102 may pass a testing routine of the tester instrumentation 106 by having sufficient radiative power to enable reliable reception by a radiative element within the DUT placed within the envelope, but insufficient radiative power to enable reliable reception by a radiative element within the DUT placed outside the envelope. In this example, the envelope may be less than 20 mm in its longest dimension and the radiative element within the DUT may have a longest dimension of less than 10 mm.

Figure 3:
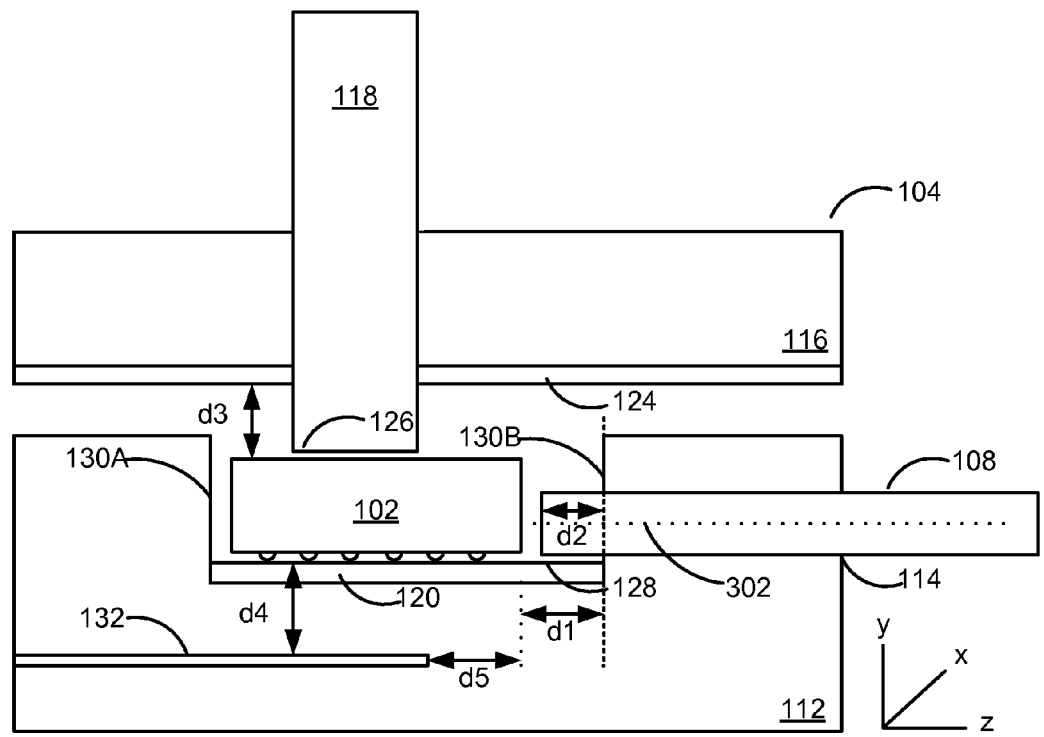
FIG. 3 illustrates a side view of a test socket, in accordance with an embodiment of FIG. 1.
Figure 4:
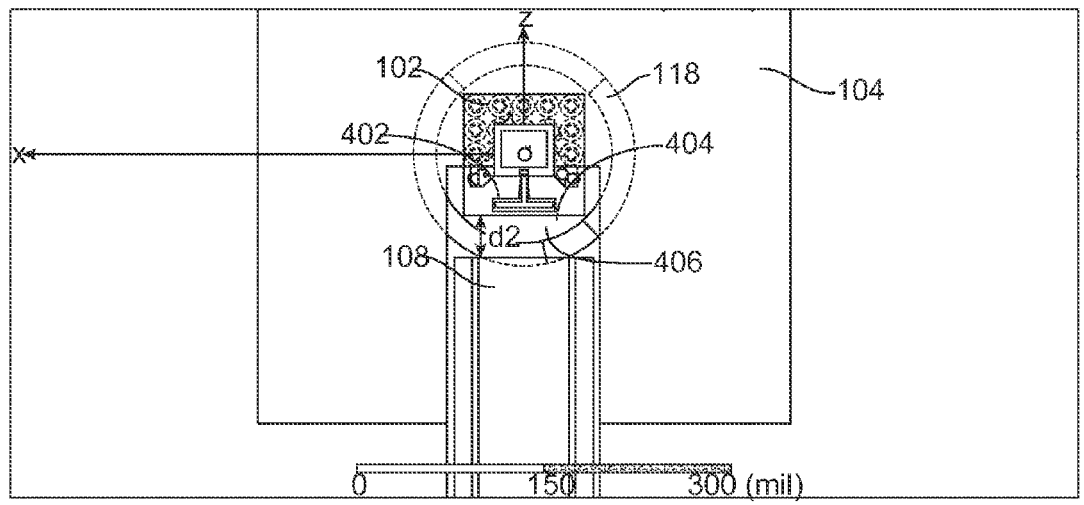
FIG. 4 illustrates a top view of a scale drawing of a test socket, in accordance with an embodiment of FIG. 1.
Figure 5:
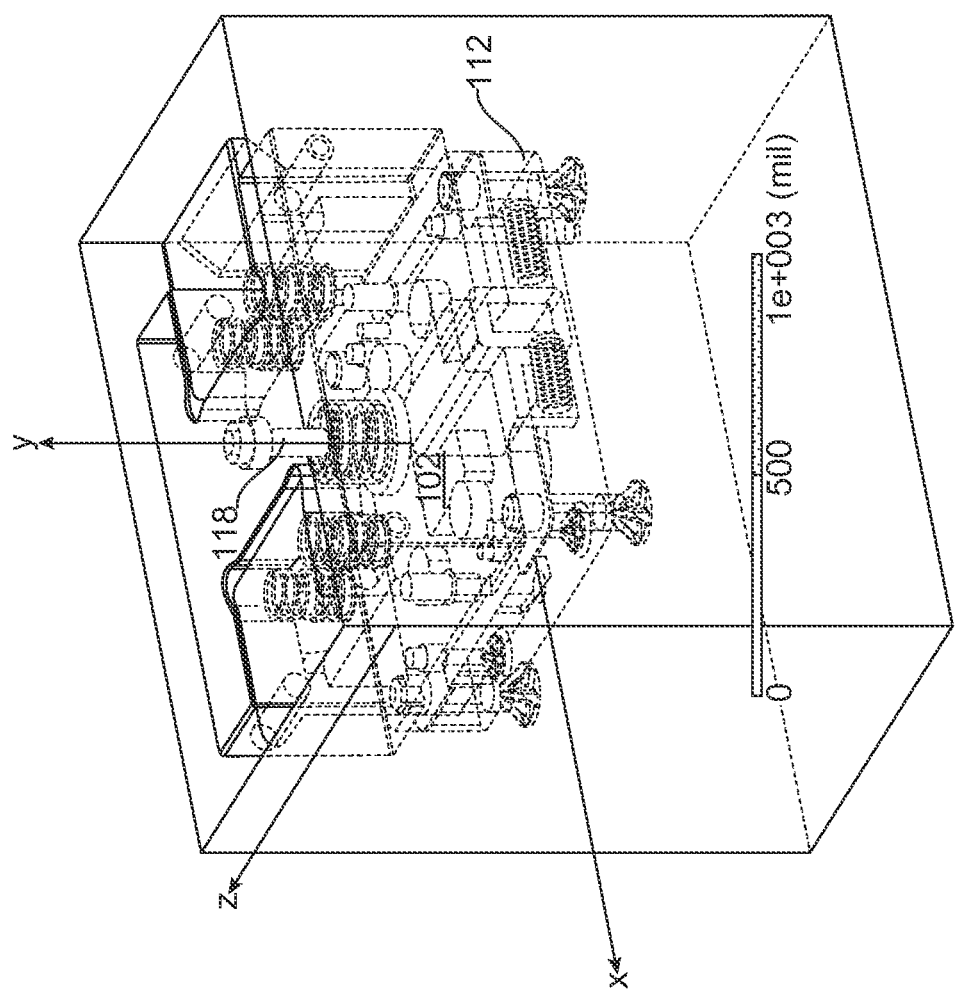
FIG. 5 illustrates a perspective view of a scale drawing of a test socket, in accordance with an embodiment of FIG. 1.
Figure 6:
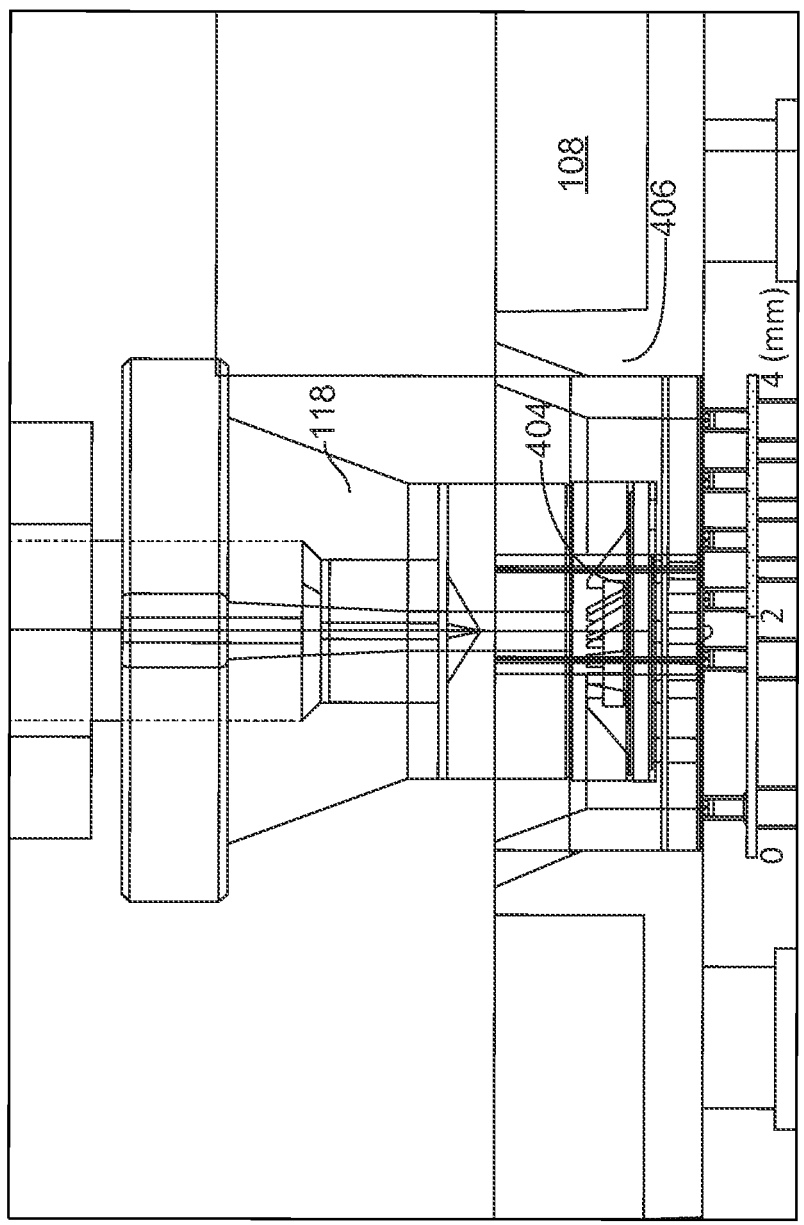
FIG. 6 illustrates a scale drawing of a side view of a test socket that shows a plunger in a closed position, in accordance with an embodiment.

FIG. 3 shows a side view of a test socket 104 in accordance with an embodiment. FIGS. 4 and 5 show a top view and perspective view of an example design for such a test socket 104. FIG. 6 shows the test socket 104 when the plunger 118 is in a closed position. As described with respect to FIG. 2, the structure of the socket cavity of the test socket 104 may be used to increase coupling of electromagnetic radiation emitted from the DUT 102 into the waveguide 108. The socket cavity is formed by a major surface of the socket base 128 for receiving placement of the DUT 102 and socket walls, including socket walls 130A and 130B. Socket wall 130B includes an aperture to receive the waveguide 108. The dimensions of the aperture 108 may be configured to align a first end of the waveguide 108 to couple a specified threshold amount of radiation from the DUT 102.

The test socket is configured to maximize the energy coupling between the radiative element within the DUT and the waveguide by setting the displacement of the waveguide center line relative to the radiative element center line. The aperture is configured to position the centerline 302 of the aperture within a specified distance from the centerline of the radiative element within the DUT 102. The specified distance may vary depending on attributes of the DUT 102 or the arrangement of the components that comprise the test socket 104. Example attributes of the DUT 102 may include the firing angle from which radiation is emitted from the DUT 102, the level of radiation emitted from the DUT 102, and the type of antenna included in the DUT 102. The aperture may also be positioned, such that a distance d1 between the face of the aperture and the emitting edge of the DUT 102 in a range of 1.20 mm to 1.30 mm. The first end of the waveguide 108 may extend a distance d2 from the aperture face within the socket cavity to create an air gap between the DUT 102 and the waveguide 108. In some embodiments, the distance d2 is less than 2 mm. FIG. 4 shows a top view of a test socket 104 that includes a DUT 102. The DUT 102 includes a radiative element 402 located proximate to an emitting face 404 of the DUT 102. The air gap 406 is formed between the end of the waveguide 108 and the emitting face 404 of the DUT 102.

Returning to FIG. 3, to more efficiently couple electromagnetic radiation emitted from the DUT 102 into the waveguide 108, test socket 104 structures such as lid 116 and plunger 118 positioned above the DUT 102, are preferably comprised of materials with high relative permittivity (Er), for example with a relative permittivity of at least 5 or 6 or higher. To further increase the coupling of electromagnetic radiation from the DUT 102 into the waveguide 108, structures that extend into the socket cavity during testing, like the plunger 118 and socket lid 116, may be coated with materials that reflect electromagnetic radiation.

In one embodiment, a conductive plate 124 may be attached to or embedded into the plunger 118 and/or the socket lid 116. The conductive plate 124 may be comprised of an electrically conductive material. Example electrically conductive materials include metals, such as copper and aluminum, may be selected based on frequency of the signal being coupled between the waveguide 108 and the DUT 102. For example, a sheet of copper may be embedded into the plunger 118 or placed on specified surface (e.g., lower surface 126) of the plunger 118 to increase the amount of electromagnetic radiation from DUT 102 that is coupled into the waveguide 108. FIG. 6A shows an example where a conductive sheet is embedded into the plunger 118. Other example reflective materials include aluminum. The position of the conductive plate 124 relative to the DUT 102 may be adjusted to maximize the amount of electromagnetic radiation coupled from the DUT 102 into the waveguide 108. In one implementation, a major surface of the conductive plate 124 that faces the socket cavity may be positioned a distance d3 from an upper surface of the DUT 102, where the distance d3 ranges from 2 mm to 3 mm. In other implementations, the distance d3 may have a smaller or greater range depending on the test socket 104 parameters.

Socket structures such as the socket walls 130 in the vicinity of the DUT 102 and waveguide 108 end, are comprised of a material with a low relative permittivity (Er), for example less than 5 or 4, in order to absorb the electromagnetic radiation leakage from the air gap between the emitting edge of the DUT 102 and the waveguide 108. The materials of one or more surfaces forming the socket cavity of the test socket 104 may comprise reflective materials with a relative permittivity (Er) of at least 5 to optimize the amount of electromagnetic radiation from DUT 102 that is coupled into the waveguide 108.

In some implementations, one or more surfaces of the socket cavity may comprise materials that absorb electromagnetic radiation from the DUT 102. Absorptive materials include, for example, TORLON PAI (polyamide-imides high strength plastic), and SEMITRON plastic). Absorptive materials may be used to reduce the amount electromagnetic energy coupled into the waveguide 108 from the DUT 102.

In one embodiment, a reflective plane 132 is positioned below the DUT 102 to increase the coupling of the electromagnetic radiation from the radiative element within the DUT 102 into the waveguide 108. The reflective plane 132 may be comprised of a material suitable to reflect electromagnetic radiation in the EHF band of the electromagnetic spectrum. Example materials include metals, such as copper. The position of the reflective plane 132 relative to the DUT 102 operates to shape the envelope of the electromagnetic radiation from the radiative element included in the DUT 102. This allows more efficient coupling of the signal into and out of the waveguide 108. In one embodiment, the reflective plane 132 is located within a fixed position in the socket base 112. For example, the surface of the reflective plane 132 facing the DUT 102 may be located a distance d4 below the DUT 102 and the edge of the reflective plane 132 may be located at a distance d5 from the emitting face of the DUT 102. In this example, the distance d4 may be in a range of 5 mils to 10 mils and the distance d5 may be in a range of 1 mm to 2 mm.

In another embodiment, the position of the reflective plane 132 may be adjusted relative to the position of the DUT 102. The adjust mechanism may be an electro-mechanical mechanism that provides adjustment of the reflective plane 132 in multiple dimensions responsive to test signals from the tester instrumentation 106. For example, the position of the reflective plane 132 may be adjusted along one or more of the x, y, or z-axis. For example, the position adjustment mechanism is configured to translate the reflective plane 132 relative to the DUT 102 along the z-axis, thereby changing a separation d5 between the reflective plane 132 and the edge of the waveguide 108. The reflective plane 132 may also rotate about the x- or z-axis enabling the reflective plane 132 to tilt relative to the lower surface of the DUT 102. The spacing d3 between the reflective plane 132 and the bottom surface of the DUT 102 may also be adjusted. By adjusting the position of the reflective plane 132 relative to the position of the DUT 102, the firing angle (i.e., angle of propagation) of the electromagnetic radiation emitted from the radiative element within the DUT 102 may be adjusted. In another embodiment, the reflective plane 132 is removable to allow use of multiple reflective plane 132 configurations for each test socket 104.

Figure 7:
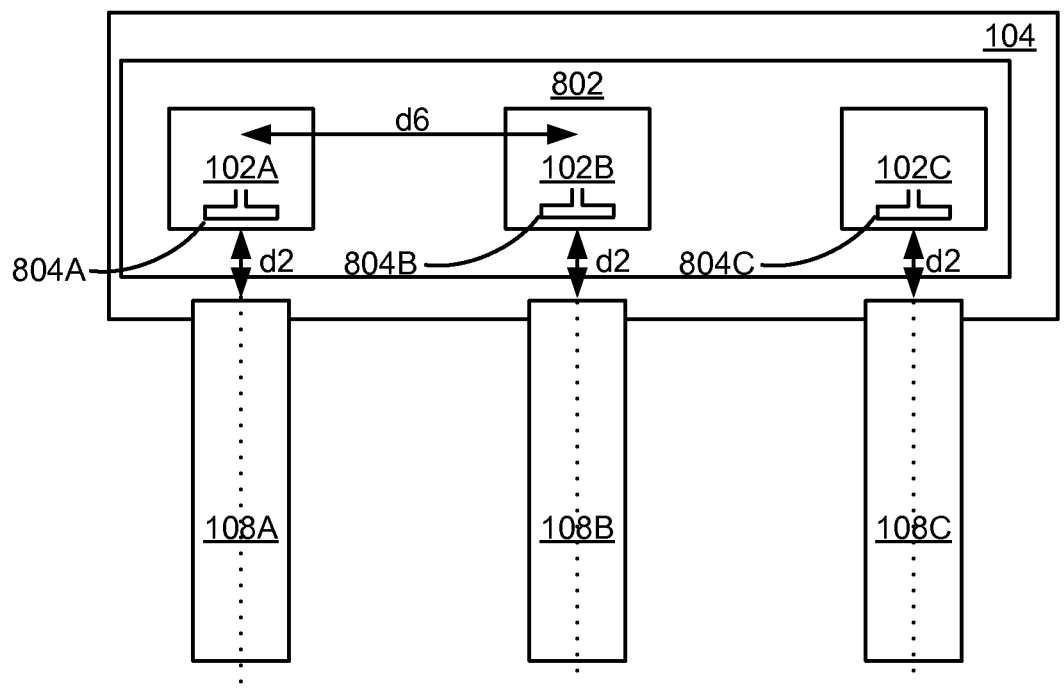
FIG. 7 illustrates a block diagram of a test socket with multiple integrated waveguides for testing a module with multiple extremely high frequency integrated circuits, in accordance with an embodiment.
Figure 8:
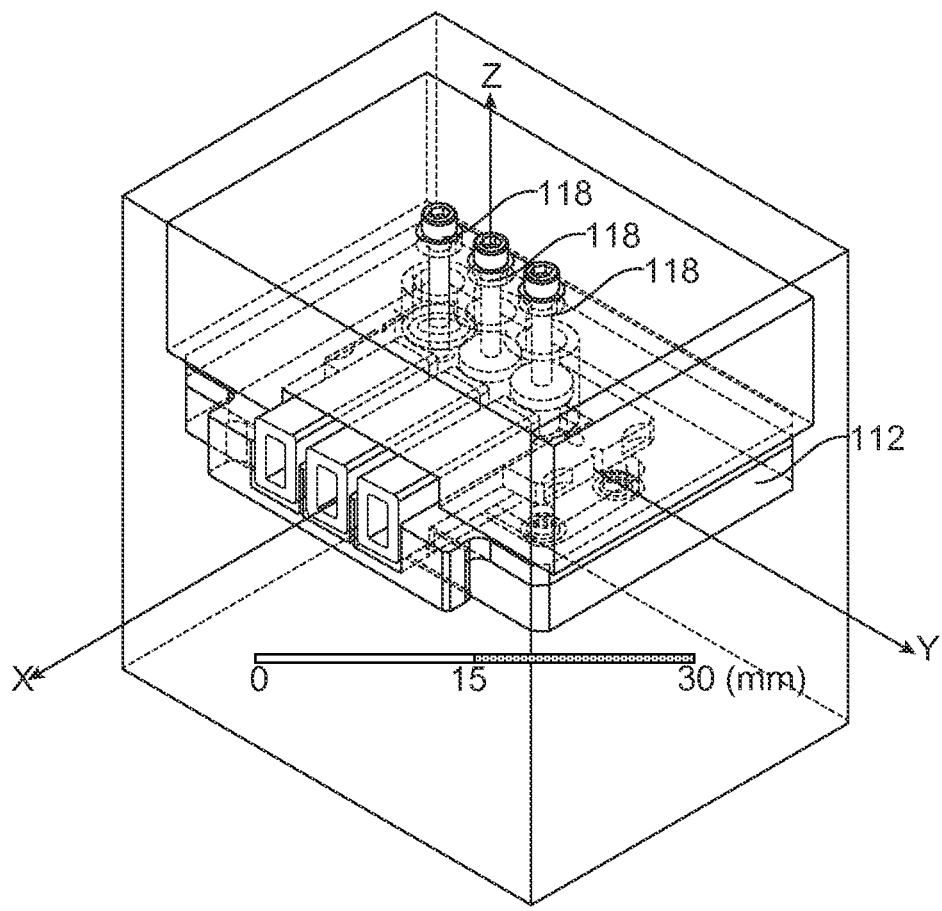
FIG. 8 illustrates a scale drawing of a perspective view of a test socket, in accordance with an embodiment of FIG. 7.

FIG. 7 shows a top view of a test socket 104 configured to test a module 802 under test that includes multiple DUTs 102. FIG. 8 shows a perspective view of an example design for such a test socket 104. Returning to FIG. 7, the multiple DUTs 102 may be implemented on separate integrated circuits or may be implemented on a single integrated circuit. Depending on the implementation, multiple DUTs 102 may be placed in any relative position on the test socket 104 or module 802, such as adjacent to each other, across from each other and/or on neighboring edges of the test socket 104. Each DUT 102 may be paired to a waveguide 108. One end of each corresponding waveguide may be integrated or non-integrated into the test socket 104 as previously described. Since electromagnetic signals to and from each DUT 102 are substantially contained within each waveguide 108, cross-talk between DUT 102 signals is minimized once they are coupled into the waveguide 108, thereby allowing testing of multiple devices under test (i.e., multi-site testing) in a single test socket.

The test socket 104 include multiple waveguides 108A-C integrated into the test socket 104, each waveguide 108 having a first end positioned to receive electromagnetic radiation that is emitted by a different radiative element 804A-C of the DUTs 102A-C during testing. Each waveguide 108 relays the received electromagnetic radiation from its respective radiative elements 804A-C to the tester instrumentation 106 for analysis. The test module 802 may contain a plurality of DUTs 102A-C arranged in predetermined positions. The radiative elements included in adjacent DUTs 102 may be separated by a specified distance such that each DUT 102 on the test module 802 may be tested separately from the other DUTs 102 on the test module 802 by the test system 100. For example, in one implementation, the radiative elements 804A and 804B within adjacent DUTs 102A and 102B (or centerlines of their corresponding waveguides 108A and 108B) are separated by a distance d6 ranging from 5 mm to 10 mm. In another implementation, the radiative elements 804A and 804B are separated by a distance d6 of no more than 20 mm. The distance d6 may vary depending on the materials comprising the waveguide 108 or the test socket 104, or the configuration of the waveguide 108, test socket 104, and DUTs 102.

Because the disclosed test system allows multiple DUT's 102 located in close proximity, the tester instrumentation 106 may also perform testing to measure cross talk between radiative elements included in DUTs 102 on test module 802. Measuring cross talk allows the determination of interference between DUTs 102 in a module 802. The DUTs 102 may be a combination of transmitters and receivers. The ability to measure cross talk is especially beneficial in modules that have transmitter DUTs 102 adjacent to receiver DUTs 102. Further, each DUT 102 may also switch between acting as a transmitter and receiver. For example, each DUT 102 within the test module 802 may be tested separately and signals captured by each waveguide 108A-C may be measured. The waveguides 108A-C may be substantially parallel to each other, bent away from each other or curved according to testing needs.

In measuring cross talk, each DUT 102 is associated with a channel. The channels may be turned on and off by the tester instrumentation 106 to allow for measuring cross talk. For example, when measuring cross talk from one DUT 102A, the channel for the DUT 102A remains on while other DUT 102B and 102C channels may be switched on or off. The signal received and measured by the tester instrumentation 106 from channels where the corresponding DUTs 102B and 102C are switched off represents the cross talk generated from the DUT 102A whose channel was switched on.

Testing of DUTs 102 spaced within close proximity (e.g., 20 mm) of each other would not be possible using horn antenna based test system. Eliminating horn antennas allows DUTs 102 to be placed in closer proximity without compromising the integrity of the test signal, thereby allowing for the manufacturing of more compact test sockets 104 for testing a predetermined number of DUTs 102.

The above descriptions above are just examples. Other embodiments are contemplated. For example the DUT 102 may include a transceiver circuit and a radiative element within the DUT 102 integrated onto the same silicon or gallium arsenide or other semiconductor substrate as the transceiver circuit included in the DUT 102, or a radiative element that is otherwise located inside or outside the same package as the transceiver circuit. More than one transceiver may be integrated onto the same semiconductor substrate. The radiative element may have a metal reflector near it to direct the electromagnetic radiation in a certain direction. The directional terms up, down, top, bottom, side, etc. are defined relative to the DUT 102.

The DUT 102 may be a transmitter without a receiver, or may be a transceiver with the receive function disabled, either permanently or temporarily. Likewise, a known good receiver in the tester instrumentation may be a transceiver that has its transmitter disabled. Electrical connections between the DUT 102 and the interconnect board 120 may be pins, mating pads, balls, or edge connectors, which may be arranged in grids, lines, a perimeter, or other arrangements. The plunger 118 may use springs, clips, clamps, or other components to clamp DUT 102 to the socket base 112. The plunger 118 may be part of a robotic system. The DUT 102 may be placed into position when the plunger 118 is open, then plunger 118 is closed for testing. A robotic arm may move, place, insert, and remove DUT 102. Many physical configurations of socket base 112 and the plunger 118 are possible.

The aperture 114 may be a hole with a round cross-section, a rectangular hole with a rectangular cross-section, a triangular, hexagonal, or other hole with a triangular, hexagonal, or other cross-section such as any polygon or shape. The aperture 114 may be a cut made with a saw or other cutting device, or may be formed during manufacture of the test socket. An existing opening in the test socket 104 may be used for the aperture 114.

The waveguide 108 may be a solid flexible cable of plastic that has a high relative permittivity (dielectric constant) and a low loss tangent. Plastic materials are generally of low cost, reducing the cost of the test apparatus compared with horn antennas. The length and cross-section of this cable may be tuned to the frequency of the electromagnetic radiation, such as 60 GHz. The waveguide 108 may be plastic and include a small cavity filled with air or other material may be used. The waveguide 108 may be made entirely from the same plastic material, or could have regions of different plastic or other materials. Discontinuities of materials could be strategically introduced for various purposes, such as to reflect, deflect, or split electromagnetic radiation.

The shapes and orientation of close-proximity radiation envelopes 200 as shown in FIG. 2 are simplified. Real radiation patterns may have variations in intensities, nodes, relative maxima and minima, may bend around objects or through objects such as parts of socket base 112 or plunger 118, and may spread out or narrow in unusual ways. Actual envelopes 200 may be asymmetric and have odd shapes. Envelope 200 may be simulated or measured with various instruments. In the example shown in FIG. 2, the "size" of envelope 200 is typically defined as measured to the 3 dB power point.

A known-good transceiver could be set to transmit, and DUT 102 operating as a transceiver set to receive, with electromagnetic radiation traveling in a reverse direction in the waveguide 108.

In some embodiments, a test socket 104 may support testing multiple DUTs 102 where the number of DUTs 102 is greater than the number of waveguides 108. That is, electromagnetic radiation from more than one DUT is coupled into one waveguide. In one implementation, a marker or identifier may be associated with each DUT 102 so that the test instrumentation 106 may distinguish test responses from multiple DUTs 102 received over a single waveguide 108. In one example, different levels of amplitude modulation may be applied to signal responses traveling on the waveguide 108 from different DUTs 102. Employing amplitude modulation allows multiple DUT's 102 emitting electromagnetic radiation at different frequencies to be tested using a single waveguide 108. In another example, each DUT 102 coupled to a single waveguide 108 may send a test response at a different data rate so that the tester instrumentation 106 may distinguish between signals from different DUTs.

One skilled in the art will readily recognize from the following description that alternative embodiments of the structures and methods illustrated herein may be employed without departing from the invention.

What is claimed is:

1. A test system for testing an integrated circuit Device-Under-Test (DUT), the DUT including a radiative element that emits close-proximity radio frequency (RF) electromagnetic radiation, the test system comprising:
    a test socket that holds the DUT during testing;
    an interface board electrically connected between tester instrumentation and electrical contacts of the DUT during testing;
    a waveguide integrated into the test socket, the waveguide having a first end positioned to receive the RF electromagnetic radiation side emitted by the DUT during testing, the waveguide relaying the RF electromagnetic radiation to the tester instrumentation;
    a reflective plane positioned below the DUT to reflect the RF electromagnetic radiation, the reflective plane increasing coupling of the RF electromagnetic radiation from the DUT into the waveguide; and
    a position adjustment mechanism to adjust a position of the reflective plane relative to a position of the DUT.

2. The test system of claim 1, wherein the reflective plane is positioned 5-10 mil below the DUT.

3. The test system of claim 1, wherein the position adjustment mechanism is configured to tilt the reflective plane relative to the DUT.

4. The test system of claim 1, wherein the position adjustment mechanism is configured to change a spacing between the reflective plane and a bottom surface of the DUT.

5. The test system of claim 1, wherein the position adjustment mechanism is configured to translate the reflective plane relative to the DUT, thereby changing a separation between the reflective plane and the first end of the waveguide.

6. The test system of claim 1, wherein adjusting the position of the reflective plane changes an angle of propagation of the electromagnetic radiation emitted by the DUT.

7. The test system of claim 1, wherein the radiative element is separated from the first end of the waveguide by an air gap.

8. The test system of claim 1, wherein the air gap is less than 2 mm.

9. The test system of claim 1, wherein the DUT when able to pass a testing routine of the tester instrumentation has sufficient radiative power to enable reliable reception by a receiver radiative element placed within an envelope of the RF electromagnetic radiation, but insufficient radiative power to enable reliable reception by a receiver radiative element placed outside the envelope.

10. The test system of claim 9, wherein the envelope is less than 2 centimeters in its longest dimension.

11. The test system of claim 9, wherein the radiative element has a longest dimension that is less than 1 centimeter.

12. The test system of claim 1, wherein the RF electromagnetic radiation side emitted from the DUT is EHF radiation having a frequency between 30 GHz and 300 GHz.

13. The test system of claim 1, wherein the test socket comprises:
a socket base with a cavity, the cavity receiving the DUT during testing; and
a socket plunger situated above the socket base, the socket plunger pressing the DUT into the cavity during testing.

14. The test system of claim 13, wherein the tester instrumentation controls the socket plunger to automatically and sequentially obtain and then press DUTs into the cavity for testing.

15. The test system of claim 13, wherein the socket plunger includes a conductive sheet that increases coupling of the RF electromagnetic radiation from the DUT into the waveguide.

16. The test system of claim 13, wherein the socket plunger is composed of a material with a permittivity (Er) of at least 5.

17. The test system of claim 13, further comprising a socket lid, the socket plunger extending through the socket lid into the cavity, the socket lid including a conductive sheet.

18. The test system of claim 13, wherein a portion of the cavity in proximity to the first end of the waveguide is composed of a material with a permittivity (Er) of at least 5.

19. The test system of claim 1, wherein the DUT includes a plurality of radiative elements that each side emits close-proximity RF electromagnetic radiation, the test system comprising a plurality of waveguides integrated into the test socket, each waveguide having a first end positioned to receive RF electromagnetic radiation side emitted by a different radiative element of the DUT during testing, each waveguide relaying the received RF electromagnetic radiation to the tester instrumentation.

20. The test system of claim 19, wherein the radiative elements are separated by not more than 20 mm.

21. The test system of claim 19, wherein the radiative elements are separated by not more than 10 mm.

22. The test system of claim 19, wherein the test system is configured to measure cross talk between the radiative elements.

23. The test system of claim 19, wherein each radiative element can be tested independently from the other radiative elements.

24. The test system of claim 1, wherein the DUT can be tested without use of a radiation chamber.

25. The test system of claim 1, wherein the DUT can be tested without use of a horn antenna.

26. The test system of claim 1, wherein the waveguide is hollow.

27. The test system of claim 1, wherein the waveguide is a dielectric waveguide.

28. The test system of claim 1, wherein the waveguide is flexible.

29. The test system of claim 1, wherein the tester instrumentation is configured to measure radiated power.

30. The test system of claim 1, wherein the tester instrumentation is configured to measure receiver sensitivity.

31. The test system of claim 1, wherein the tester instrumentation is configured to measure jitter.

32. The test system of claim 1, wherein the position adjustment mechanism is electronic and/or mechanical.

* * * * *